United States Patent [19]
Gong et al.

[11] Patent Number: 6,159,802
[45] Date of Patent: Dec. 12, 2000

[54] METHOD OF FORMING A STACK-GATE OF A NON-VOLATILE MEMORY ON A SEMICONDUCTOR WAFER

[75] Inventors: Yo-Yi Gong, Hsin-Chu; Tien-Jui Liu, Tai-Chung Hsien, both of Taiwan

[73] Assignee: United Microelectronics Corp., Hsin-Chu, Taiwan

[21] Appl. No.: 09/352,750

[22] Filed: Jul. 14, 1999

[51] Int. Cl.[7] .............................................. H01L 21/8247
[52] U.S. Cl. ........................... 438/261; 438/974; 438/258
[58] Field of Search ............................ 438/974, 257–267

[56] References Cited

U.S. PATENT DOCUMENTS

| | | | |
|---|---|---|---|
| 5,861,347 | 1/1999 | Maiti et al. | 438/787 |
| 5,888,869 | 3/1999 | Cho et al. | 438/258 |
| 5,923,975 | 7/1999 | Rolandi | 438/258 |

*Primary Examiner*—Richard Booth
*Attorney, Agent, or Firm*—Winston Hsu

[57] ABSTRACT

The invention relates to a method of forming a stack-gate of a non-volatile memory. In this method, the stack-gate is formed in a predetermined region of the substrate of a semiconductor wafer. Then, a gate oxide layer, a first gate conductive layer, a dielectric layer, and a passivation layer are formed followed by lithography and stripping of the photo-resist layer and removal of the passivation layer from the dielectric layer. Finally, a second gate conductive layer is formed on the dielectric layer as the control gate of the stack-gate. The passivation layer can prevent the dielectric layer from being damaged during stripping of the photo-resist layer.

10 Claims, 3 Drawing Sheets

6,159,802

METHOD OF FORMING A STACK-GATE OF A NON-VOLATILE MEMORY ON A SEMICONDUCTOR WAFER

BACKGROUND OF THE INVENTION

1. Field of the Invention

The invention relates to a method of forming a gate, and more particularly, to a method of forming a stack-gate of a non-volatile memory.

2. Description of the Prior Art

A metal oxidation semiconductor (MOS) transistor is used as a non-volatile memory in an integrated circuit. Storage of data in memory is accomplished by switching the gate on or off. Switching the gate on or off is regulated by the use of different threshold voltages. Even if the power source is switched off, the data stored in the memory is retained. The standard stack-gate used in a non-volatile memory has inducing charges to store the signal "1" in the memory. Only a small amount of energy is required when the data in the memory has to be changed.

Please refer to FIG. 1. FIG. 1 is a sectional perspective diagram of a prior art stack-gate 20 of a non-volatile memory. The prior art stack-gate 20 is formed on a substrate 11 of a semiconductor wafer 10. The stack-gate 20 comprises a gate oxide layer 16 formed on the substrate 11 to be used as a gate insulating layer, a first gate conductive layer 18 formed on a predetermined region of the gate oxide layer 16, a dielectric layer 22 on the first gate conductive layer 18, and a second gate conductive layer 24 on the dielectric layer 22. The first gate conductive layer 18 and the second gate conductive layer 24 are made of poly-silicon. The first gate conductive layer 18 is used as a floating gate for storing charges. The second gate conductive layer 24 is used as a control gate for controlling data access. The dielectric layer 22 has an ONO (Oxide/Nitride/Oxide) structure in which a nitride oxide layer is sandwiched between two separate oxide layers.

When a high voltage is applied to the control gate (the second gate conductive layer 24) of the stack-gate 20, carrier multiplation occurs on the drain and hot electrons are generated. Some of the hot electrons transverse the gate oxide layer 16 and become injected into the floating gate (the first gate conductive layer 18) causing the floating gate to become charged. The charges from the hot electrons enter the floating gate secondary to contact with the dielectric layer 22 and gate oxide layer 16. In this way, data is stored.

In order to simplify the production process, the gate of the MOS transistor surrounding the non-volatile memory is formed at the same time the second gate conductive layer 24 of the stack-gate 20 is produced. In order to form the gate of the MOS transistor, a lithography process and resist stripping process must be performed prior to the production of the second gate conductive layer 24. In the ONO structure of the dielectric layer 22, the oxide layer on the surface is so thin that it is easily damaged by the resist stripping process. This affects performance of the dielectric layer 22 and may make the charges in the floating gate leak thereby reducing the data stability of the non-volatile memory.

SUMMARY OF THE INVENTION

It is therefore a primary objective of the present invention to provide a method of forming a stack-gate of a non-volatile memory. The method can prevent damage to the dielectric layer to resolve the mentioned problem.

Briefly, in a preferred embodiment, the present invention provides a method of forming a stack-gate in a non-volatile memory, the stack-gate being formed in a predetermined region of the substrate of a semiconductor wafer, the method comprising:

forming a gate oxide layer in the predetermined region;

forming a first gate conductive layer on the gate oxide layer to be used as a floating gate of the stack gate;

forming a dielectric layer on the first gate conductive layer;

forming a passivation layer on the dielectric layer;

performing a lithography process and resist stripping process wherein the passivation layer prevents the dielectric layer from becoming damaged during the resist stripping process;

removing the passivation layer from the dielectric layer; and forming a second gate conductive layer on the dielectric layer to be the control gate of the stack-gate.

It is an advantage of the present invention that the method according to the present invention forms the passivation layer on the dielectric layer 42 of the ONO structure for preventing damage to the dielectric layer 42. Therefore, the dielectric layer of the stack-gate stores charges well in the stack-gate and enhances data stability in the non-volatile memory.

These and other objects and the advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
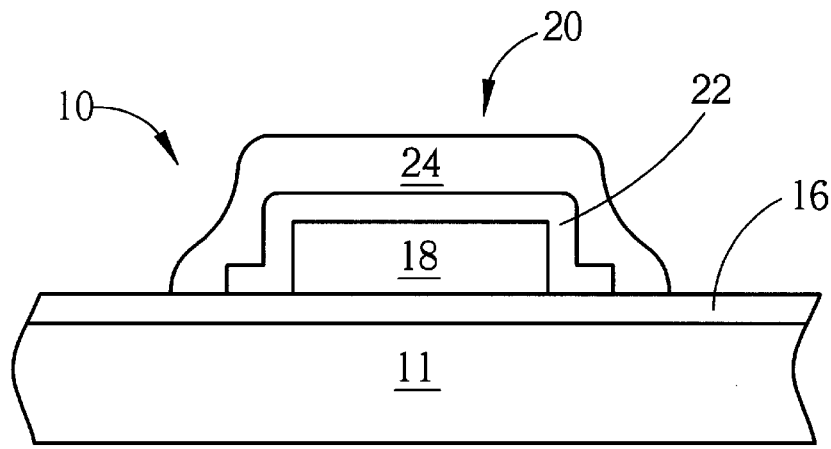
FIG. 1 is a section perspective diagram of a prior art stack-gate of a non-volatile memory.
Figure 2:
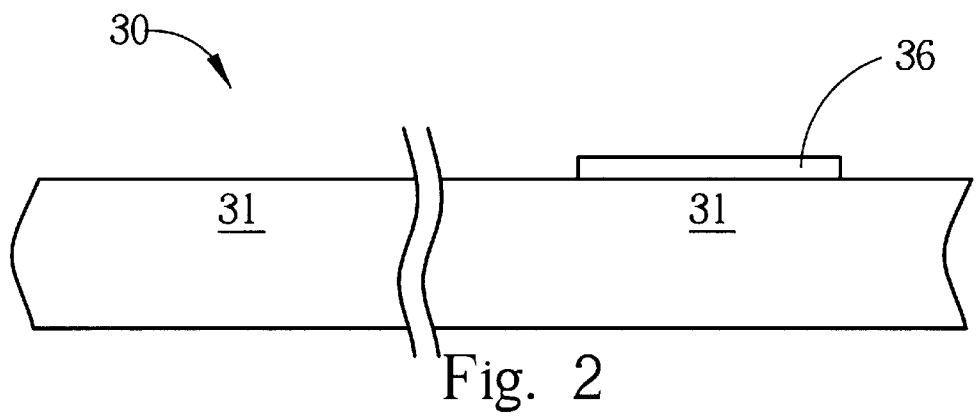
FIG. 2 to FIG. 9 are perspective diagrams of a method for producing a stack-gate of a non-volatile memory according to the present invention.
Figure 3:
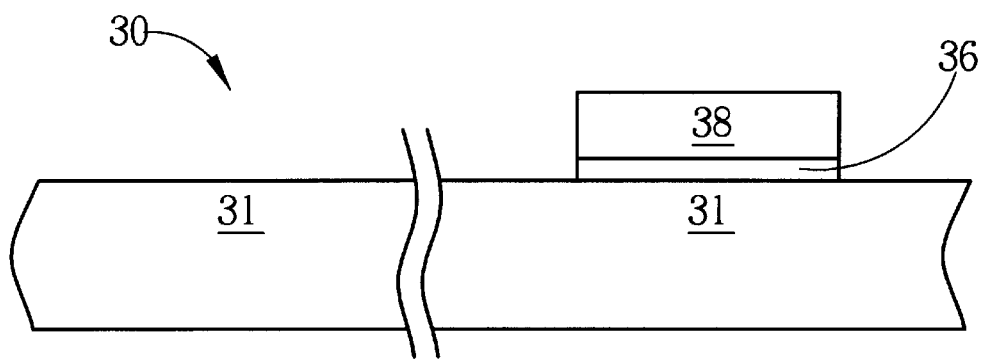

Please refer to FIG. 2 to FIG. 9. FIG. 2 to FIG. 9 are perspective diagrams of a method for producing a stack-gate 40 of a non-volatile memory according to the present invention. The present invention is a method for producing a stack-gate 40 of a non-volatile memory. The stack-gate 40 is formed in a predetermined region of the substrate 31 of a semiconductor wafer 30. When producing the stack-gate 40, a gate 54 of a transistor 50 surrounding the nor-volatile memory is formed outside the predetermined region at the same time. An oxidation process is performed on the predetermined region of the substrate 31 to form a silicon oxide layer for use as a gate insulating layer 36, as shown in FIG. 2. Then, a first gate conductive layer 38 made of poly-silicon comprising a predetermined density dopant is formed on the gate insulating layer 36 to be used as a floating gate of the stack gate 40, as shown in FIG. 3.

Figure 4:
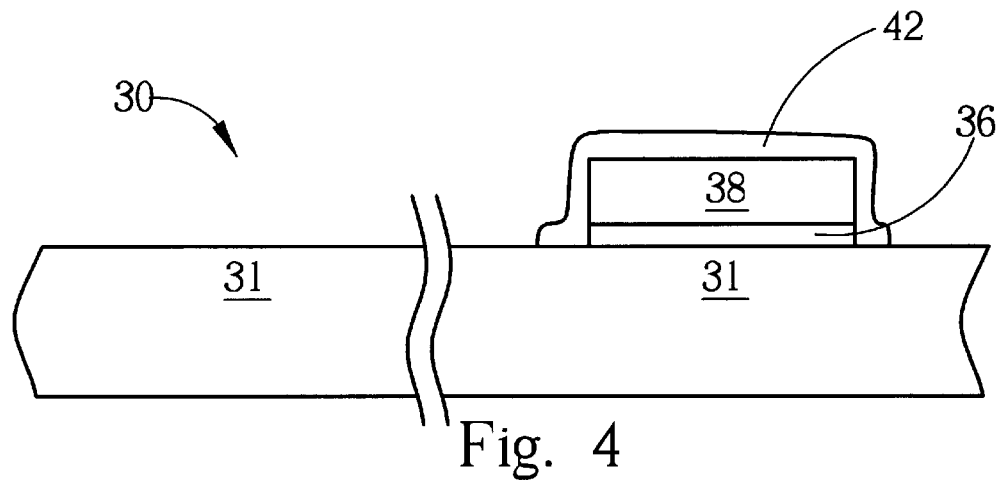
Figure 5:
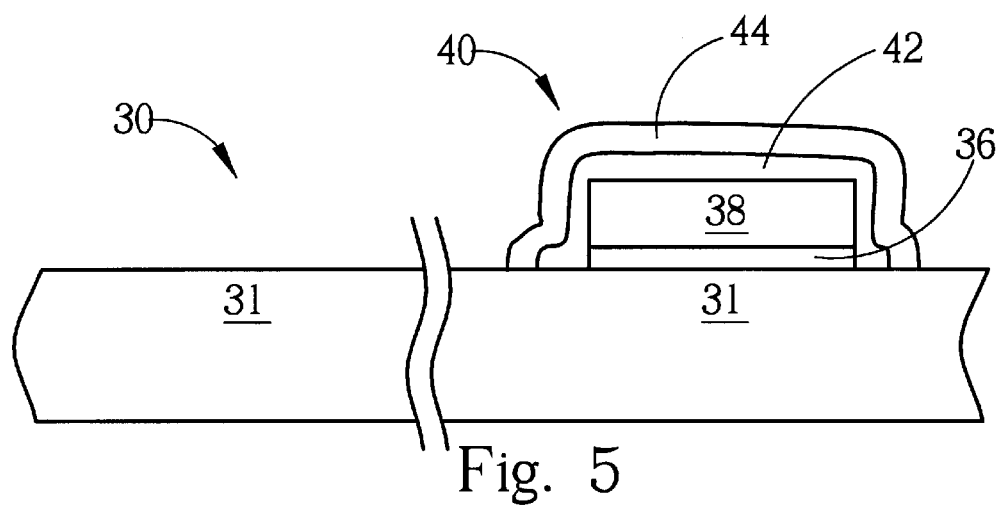

FIG. 4 illustrates the formation of the dielectric layer 42 on the first gate conductive layer 38. A chemical vapor deposition method is performed to deposit a first silicon oxide layer and a silicon nitride layer. The nitride layer is then reoxidized through a thermal oxidation process to form a second silicon oxide layer. Therefore, the dielectric layer 42 is composed of the first silicon oxide layer, the silicon nitride layer and second silicon oxide layer which constitutes a dielectric layer with an ONO structure. Then, a passivation layer 44 made of silicon nitride is formed on the dielectric layer 42 to pre-form the stack-gate 40, as shown in FIG. 5.

Figure 6:
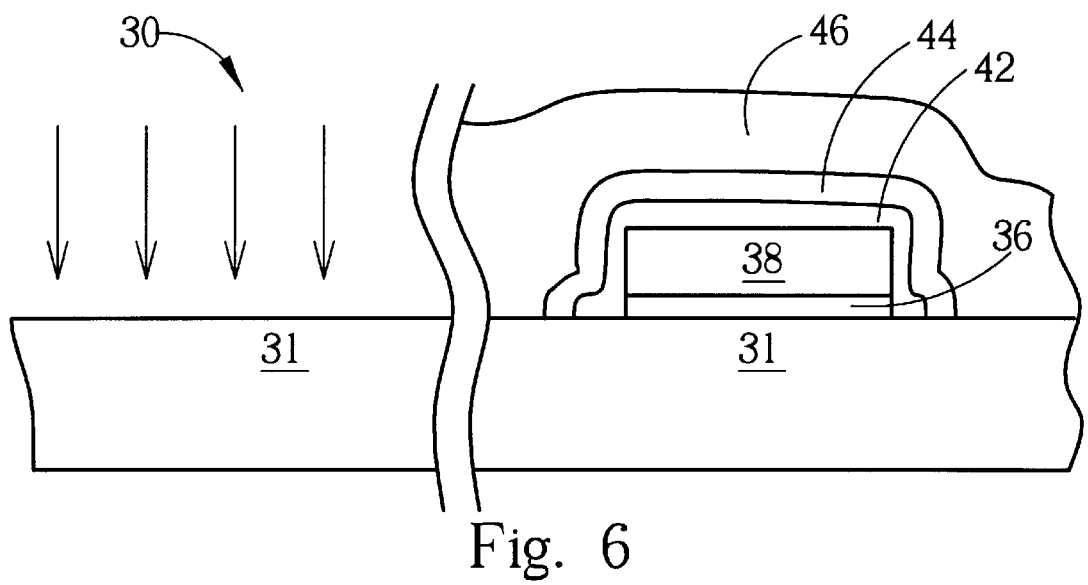

After pre-forming the stack-gate 40, a lithography process is performed to form a photo-resist layer 46 on the stack-gate 40. Then, an ion implantation process is performed to achieve a standard threshold voltage in the MOS transistor 50, as shown in FIG. 6, followed by stripping of the photo-resist layer 46. During ion implantation, the photo-resist layer 46 protects the pre-formed stack-gate 40 such that it is not affected by the process. When stripping the photo-resist layer 46, the passivation layer 44 protects the dielectric layer 42 from damage.

Figure 7:
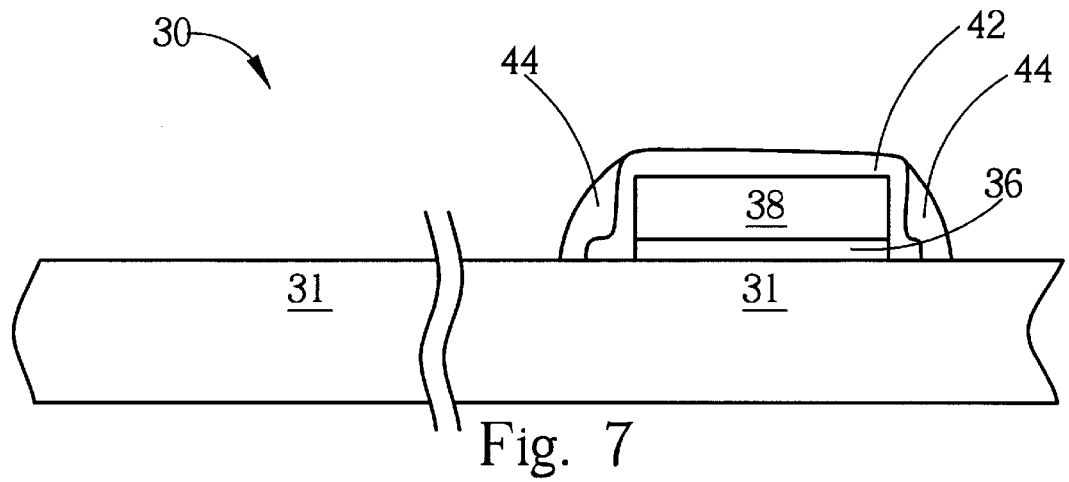

Then, an anisotropic dry etching is performed to remove a predetermined thickness of the passivation layer 44 followed by a wet etching to completely remove the passivation layer 44 from above the dielectric layer 42. After this is completed, the portions of the dielectric layer 42 surrounding the remaining passivation layer 44 is the spacer, as shown in FIG. 7.

Figure 8:
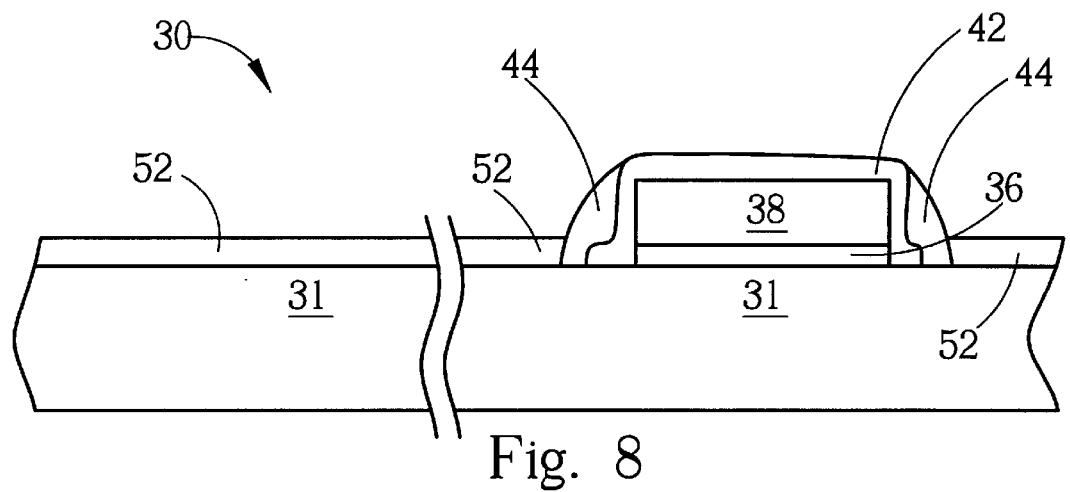

Production of the stack-gate 40 and formation of the gate 54 of the MOS transistor 50 are proceeded at the same time. First, the surface of the semiconductor wafer 30 is oxidized by using thermal oxidation to form a silicon oxide layer on the surface of the substrate 31. As seen in FIG. 8, this layer is the gate silicon oxide layer 52. Because the dielectric layer 42 has an ONO structure formed by thermal oxidation, the dielectric layer 42 is not affected during formation of the silicon oxide layer.

Figure 9:
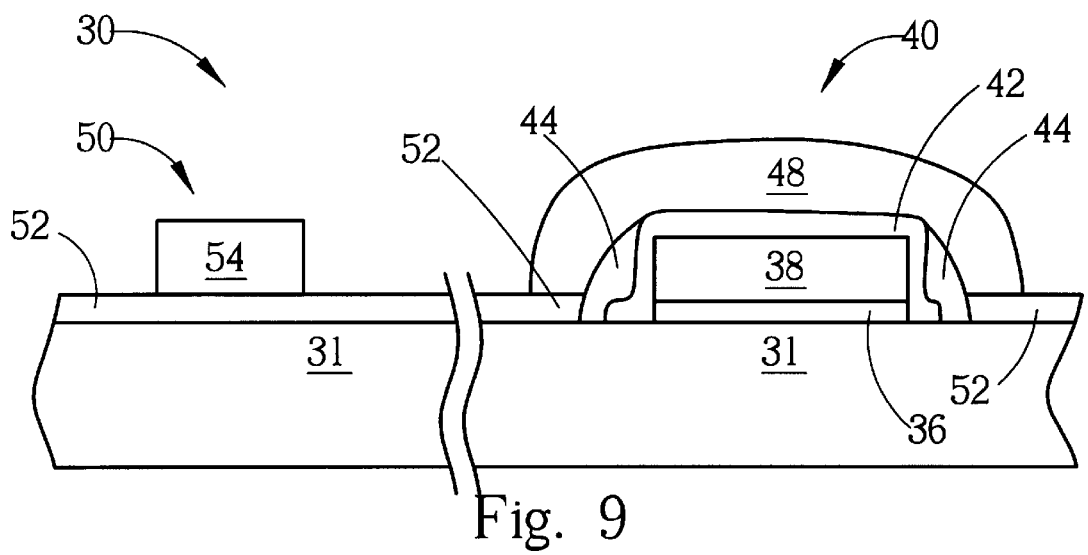

Then, a poly-silicon layer is formed in predetermined regions on the surfaces of the pre-formed stack-gate 40 and gate silicon oxide layer 52. The poly-silicon layer comprises dopant at a predetermined density. The poly-silicon layer on the surface of the pre-formed stack-gate 40 is used as a second gate conductive layer 48 of the stack-gate 40. The poly-silicon layer on the surface of the gate silicon oxide layer 52 is used as a gate 54 of the MOS transistor 50, as shown in FIG. 9. The formation of the stack-gate 40 is completed after formation of the second gate conductive layer 48.

In the stack-gate 40 according to the present invention, the first gate conductive layer 38 is used as a floating gate of the stack-gate 40. The second gate conductive layer 48 is used as a control gate of the stack-gate 40 for controlling the data access of the non-volatile memory. Because the poly-silicon in the first gate conductive layer 38 and second gate conductive layer 48 comprises dopant at a predetermined density, the stack-gate 40 can achieve a standard threshold voltage. Also, the passivation layer 44 can prevent the second silicon oxide layer of the dielectric layer 42 from becoming damaged during stripping of the photo-resist layer 46. Therefore, the dielectric layer 42 has an outstanding ability to store charges in the floating gate of the stack-gate 40 and has enhanced data stability in the non-volatile memory.

Compared with the prior art method for producing the stack-gate 20, the method for producing the stack-gate 40 according to the p:resent invention prevents damage to the dielectric layer 42 during stripping of the photo-resist layer 46 by forming a passivation layer 44 on the ONO-structured dielectric layer 42. Therefore, the dielectric layer 42 of the stack-gate 40 has an outstanding ability to store charges in the stack-gate 40 and has enhanced data stability in the non-volatile memory.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method of forming a stack-gate in a non-volatile memory, the stack-gate being formed in a predetermined region of the substrate of a semiconductor wafer, the method comprising:

forming a gate oxide layer in the predetermined region;

forming a first gate conductive layer on the gate oxide layer to be used as a floating gate of the stack gate;

forming a dielectric layer on the first gate conductive layer;

forming a passivation layer on the dielectric layer;

performing a lithography process and resist stripping process wherein the passivation layer prevents the dielectric layer from becoming damaged during the resist stripping process;

removing the passivation layer from the dielectric layer; and forming a second gate conductive layer on the dielectric layer to be the control gate of the stack-gate.

2. The method in claim 1 wherein the first gate conductive layer and the second conductive layer are made of poly-silicon.

3. The method on claim 2 wherein the polysilicon in the first conductive layer and the second conductive layer comprises a predetermined density dopant.

4. The method in claim 1 wherein the dielectric layer comprises a first silicon oxide layer, a silicon nitride layer on the first silicon oxide layer, and a second silicon oxide layer on the silicon nitride layer.

5. The method of claim 1 wherein the top silicon oxide layer of the dielectric layer is formed by a thermal oxidation process that reoxidizes the surface of the silicon nitride layer of the dielectric layer.

6. The method of claim 1 wherein the passivation layer is made of silicon nitride.

7. The method of claim 6 wherein the method of removing the passivation layer above the dielectric layer comprises:

performing an anisotropic dry etching process to remove a predetermined thickness of the passivation layer; and performing a wet etching process to completely remove the passivation layer from above the dielectric layer.

8. The method of claim 1 wherein in the formation of the dielectric layer, the dielectric layer covers the first conductive layer and surrounding areas, and in the formation of the passivation layer, the passivation layer covers the first conductive layer and surrounding areas, and after removing the passivation from above the dielectric layer, the portions of the dielectric layer surrounding the remaining passivation layer is the spacer.

9. The method of claim 1 wherein the substrate is made of silicon.

10. The method of claim 9 wherein the gate oxide layer is formed by an oxidation process that oxidizes the surface of the substrate to become silicon oxide.

* * * * *